(12) United States Patent
Kalous et al.

(10) Patent No.: US 8,806,907 B2
(45) Date of Patent: Aug. 19, 2014

(54) BATTERY ACCESS AND POWER SUPPLY ARRANGEMENTS

(71) Applicant: Master Lock Company LLC, Oak Creek, WI (US)

(72) Inventors: D. Scott Kalous, Kenosha, WI (US); Zachery T. Nave, Oak Creek, WI (US)

(73) Assignee: Master Lock Company LLC, Oak Creek, WI (US)

( * ) Notice: Subject to any disclaimer, the term of this patent is extended or adjusted under 35 U.S.C. 154(b) by 104 days.

(21) Appl. No.: 13/673,089

(22) Filed: Nov. 9, 2012

(65) Prior Publication Data

US 2013/0118216 A1  May 16, 2013

Related U.S. Application Data

(60) Provisional application No. 61/558,655, filed on Nov. 11, 2011.

(51) Int. Cl.
*E05B 47/00* (2006.01)
*E05B 67/02* (2006.01)

(52) U.S. Cl.
USPC .................. 70/278.1; 70/25; 70/38 R; 70/52; 70/277

(58) Field of Classification Search
CPC . E05B 47/00; E05B 47/0001; E05B 47/0002; E05B 47/0011; E05B 47/0012; E05B 47/02; E05B 47/06; E05B 47/0603; E05B 49/00; E05B 67/00; E05B 67/02; E05B 667/04; E05B 67/38; E05B 67/383; E05B 2047/00; E05B 2047/0001; E05B 2047/0002; E05B 2047/0048; E05B 2047/005; E05B 2047/0058; E05B 2047/0082; E05B 2047/0097; E05B 2067/00; E05B 2067/02

USPC ....... 70/22, 24, 25, 31, 35, 38 R, 51, 52, 275, 70/277, 278.1, 280, 281, 282
See application file for complete search history.

(56) References Cited

U.S. PATENT DOCUMENTS

| 656,672 A | 8/1900 | Spencer |
|---|---|---|
| 1,140,919 A | 5/1915 | Shipman |

(Continued)

FOREIGN PATENT DOCUMENTS

| CN | 1482328 | 3/2004 |
|---|---|---|
| CN | 2625517 | 7/2004 |

(Continued)

OTHER PUBLICATIONS

International Search Report and Written Opinion from International Application No. PCT/US2011/044129, mailed Dec. 13, 2011.

(Continued)

*Primary Examiner* — Christopher Boswell
(74) *Attorney, Agent, or Firm* — Calfee, Halter & Griswold LLP

(57) ABSTRACT

A battery operated device includes a housing, an operating mechanism and an internal battery disposed within the housing, and an access member assembled with the housing and movable between first and second positions. The operating mechanism includes first and second sets of electrical contacts for transmitting power to the operating mechanism, with the internal battery being electrically connectable with the first set of electrical contacts for powering the operating mechanism. The access member is movable between a first position blocking external access to the second set of electrical contacts and connecting the first set of electrical contacts to the internal battery, and a second position permitting external access to the second set of electrical contacts and disconnecting the internal battery from the first set of electrical contacts.

23 Claims, 13 Drawing Sheets

(56) References Cited

U.S. PATENT DOCUMENTS

| | | | |
|---|---|---|---|
| 1,310,634 | A | 7/1919 | Rozycki |
| 1,331,933 | A | 2/1920 | Kodish |
| 1,463,230 | A | 7/1923 | Squires |
| 1,607,758 | A | 11/1926 | Junkunc |
| 1,703,193 | A | 2/1929 | Jacobi |
| 1,719,637 | A | 7/1929 | Werner |
| 1,743,331 | A | 1/1930 | Ellison |
| 2,116,965 | A | 5/1938 | Schoorel et al. |
| 2,132,201 | A | 10/1938 | Allman |
| 2,160,294 | A | 5/1939 | Soref |
| 2,673,457 | A | 3/1954 | Miller |
| 2,691,288 | A | 10/1954 | Childs |
| 2,775,112 | A | 12/1956 | Taylor |
| 2,780,087 | A | 2/1957 | Miller |
| 2,830,447 | A | 4/1958 | Miller |
| 2,852,928 | A | 9/1958 | Miller |
| 2,931,204 | A | 4/1960 | Check |
| 3,477,261 | A | 11/1969 | Siana |
| 3,720,083 | A | 3/1973 | Wellekens |
| 3,742,739 | A | 7/1973 | Hickman |
| 3,797,004 | A | 3/1974 | Muessel et al. |
| 3,831,065 | A | 8/1974 | Martin et al. |
| 3,835,675 | A | 9/1974 | Lippisch |
| 3,901,057 | A | 8/1975 | Coley, Sr. |
| 3,979,931 | A | 9/1976 | Man |
| 4,070,882 | A | 1/1978 | Ruiz |
| 4,220,022 | A | 9/1980 | Willach |
| 4,236,394 | A | 12/1980 | Harrington et al. |
| 4,476,698 | A | 10/1984 | Treslo |
| 4,556,872 | A | 12/1985 | Masoncup et al. |
| 4,581,652 | A | 4/1986 | Kinoshita et al. |
| 4,609,780 | A | 9/1986 | Clark |
| 4,655,368 | A | 4/1987 | Bateman et al. |
| 4,726,206 | A | 2/1988 | Hsu |
| 4,754,626 | A | 7/1988 | Siegel |
| 4,766,746 | A | 8/1988 | Henderson et al. |
| 4,802,210 | A | 1/1989 | Spencer et al. |
| 4,808,993 | A | 2/1989 | Clark |
| 4,829,795 | A | 5/1989 | Taylor |
| 4,838,052 | A | 6/1989 | Williams et al. |
| 4,851,652 | A | 7/1989 | Imran |
| 4,893,248 | A | 1/1990 | Pitts et al. |
| 4,896,370 | A | 1/1990 | Kasparian et al. |
| 4,929,880 | A | 5/1990 | Henderson et al. |
| 5,022,175 | A | 6/1991 | Oncke et al. |
| 5,033,282 | A | 7/1991 | Gartner et al. |
| 5,042,277 | A | 8/1991 | Jenn-Rong |
| 5,090,222 | A | 2/1992 | Imran |
| 5,156,028 | A | 10/1992 | Jiang |
| 5,181,403 | A | 1/1993 | Lii |
| 5,184,491 | A | 2/1993 | Schittenhelm |
| 5,195,342 | A | 3/1993 | Werner |
| 5,270,681 | A | 12/1993 | Jack |
| 5,280,518 | A | 1/1994 | Danler et al. |
| 5,345,794 | A | 9/1994 | Jenks |
| 5,372,019 | A | 12/1994 | Hsiao |
| 5,392,552 | A | 2/1995 | McCarthy et al. |
| 5,404,735 | A | 4/1995 | Hsieh |
| 5,417,000 | A | 5/1995 | Chen |
| 5,419,068 | A | 5/1995 | Pages et al. |
| 5,475,996 | A | 12/1995 | Chen |
| 5,488,338 | A | 1/1996 | Seymour et al. |
| 5,495,093 | A | 2/1996 | Griffith |
| 5,506,393 | A | 4/1996 | Ziarno |
| 5,507,161 | A | 4/1996 | Broekaert et al. |
| 5,522,243 | A | 6/1996 | Kusmiss |
| 5,550,529 | A | 8/1996 | Burge |
| 5,552,777 | A | 9/1996 | Gokcebay et al. |
| 5,561,935 | A | 10/1996 | McCarthy et al. |
| 5,561,996 | A | 10/1996 | Chang |
| 5,573,412 | A | 11/1996 | Anthony |
| 5,585,866 | A | 12/1996 | Miller et al. |
| 5,587,702 | A | 12/1996 | Chadfield |
| 5,589,058 | A | 12/1996 | Bauer |
| 5,589,892 | A | 12/1996 | Knee et al. |
| 5,590,191 | A | 12/1996 | Guevara |
| 5,598,725 | A | 2/1997 | Chang |
| 5,601,440 | A | 2/1997 | Richter |
| 5,605,066 | A | 2/1997 | Hurshainen |
| 5,612,668 | A | 3/1997 | Scott |
| 5,621,996 | A | 4/1997 | Mowl, Jr. |
| 5,629,733 | A | 5/1997 | Youman et al. |
| 5,727,405 | A | 3/1998 | Cromwell |
| 5,791,172 | A | 8/1998 | Deighton et al. |
| 5,798,701 | A | 8/1998 | Bernal et al. |
| 5,815,557 | A | 9/1998 | Larson |
| 5,821,866 | A | 10/1998 | Bernal et al. |
| 5,831,537 | A | 11/1998 | Marman |
| 5,841,347 | A * | 11/1998 | Kim .......................... 70/278.1 |
| D402,636 | S | 12/1998 | Taft |
| 5,844,458 | A | 12/1998 | Bartholomew et al. |
| 5,868,013 | A | 2/1999 | Julien |
| D411,949 | S | 7/1999 | Hill |
| 5,927,112 | A | 7/1999 | Yamashita |
| 5,936,553 | A | 8/1999 | Kabel |
| 5,953,940 | A | 9/1999 | Ling |
| 5,999,095 | A | 12/1999 | Earl et al. |
| 6,011,469 | A | 1/2000 | Taft et al. |
| 6,046,558 | A | 4/2000 | Larson et al. |
| 6,047,575 | A | 4/2000 | Larson et al. |
| 6,064,430 | A | 5/2000 | Lefkowitz |
| D426,250 | S | 6/2000 | Lefkowitz |
| 6,072,402 | A | 6/2000 | Kniffin et al. |
| 6,079,241 | A | 6/2000 | Burleigh et al. |
| D427,884 | S | 7/2000 | Castellanos et al. |
| 6,249,310 | B1 | 6/2001 | Lefkowitz |
| 6,396,438 | B1 | 5/2002 | Seal |
| 6,401,501 | B1 | 6/2002 | Kajuch et al. |
| 6,425,274 | B1 | 7/2002 | Laitala et al. |
| 6,442,983 | B1 | 9/2002 | Thomas et al. |
| 6,517,127 | B1 | 2/2003 | Lu et al. |
| D471,429 | S | 3/2003 | Williams et al. |
| 6,585,302 | B2 | 7/2003 | Lin |
| 6,591,643 | B1 | 7/2003 | Cannella et al. |
| 6,598,439 | B1 | 7/2003 | Chen |
| 6,598,909 | B2 | 7/2003 | Lu |
| 6,718,803 | B2 | 4/2004 | Knoll |
| 6,761,051 | B1 | 7/2004 | Tsai |
| 6,792,779 | B1 | 9/2004 | Shen |
| 6,807,834 | B2 | 10/2004 | Tsai |
| 6,832,500 | B1 | 12/2004 | Chen |
| 6,898,952 | B1 | 5/2005 | Lin |
| 6,993,943 | B1 | 2/2006 | Chang |
| 7,117,698 | B2 | 10/2006 | Lai |
| 7,251,965 | B2 | 8/2007 | Yu |
| 7,316,141 | B2 | 1/2008 | Goldman |
| D567,628 | S | 4/2008 | Rohde et al. |
| D594,311 | S | 6/2009 | Stevens |
| D594,731 | S | 6/2009 | Plato |
| 7,562,545 | B2 | 7/2009 | Lai et al. |
| 7,571,627 | B2 | 8/2009 | Yu |
| D605,494 | S | 12/2009 | Plato |
| D629,280 | S | 12/2010 | Plato |
| D637,062 | S | 5/2011 | Plato |
| 7,934,405 | B2 | 5/2011 | Burmesch et al. |
| 7,948,359 | B2 * | 5/2011 | Marcelle et al. ............... 70/38 A |
| 8,164,105 | B2 * | 4/2012 | Fisher .......................... 340/5.73 |
| 8,225,629 | B2 * | 7/2012 | Zuraski et al. ............... 70/279.1 |
| 8,253,070 | B1 * | 8/2012 | Barnes .......................... 70/57.1 |
| 2002/0046584 | A1 | 4/2002 | Lumpkin et al. |
| 2003/0196461 | A1 | 10/2003 | Liou |
| 2004/0093914 | A1 | 5/2004 | Vito |
| 2005/0156441 | A1 | 7/2005 | Tsai |
| 2006/0283216 | A1 | 12/2006 | Marcelle et al. |
| 2007/0220929 | A1 | 9/2007 | Green |
| 2008/0173049 | A1 | 7/2008 | Burmesch et al. |
| 2008/0314093 | A1 | 12/2008 | Nave |
| 2009/0113947 | A1 | 5/2009 | Lai et al. |
| 2009/0145178 | A1 | 6/2009 | Nave et al. |
| 2009/0282876 | A1 | 11/2009 | Zuraski et al. |
| 2009/0320537 | A1 | 12/2009 | Alexander |
| 2010/0083713 | A1 | 4/2010 | Woodling |
| 2010/0095718 | A1 | 4/2010 | Lai et al. |
| 2011/0016931 | A1 * | 1/2011 | McDaid et al. ................... 70/25 |

(56) References Cited

U.S. PATENT DOCUMENTS

2012/0324967 A1* 12/2012 Goren et al. .............. 70/280
2013/0055773 A1* 3/2013 Li .............................. 70/278.1
2014/0028443 A1* 1/2014 Ebner ........................ 340/10.1

FOREIGN PATENT DOCUMENTS

| | | |
|---|---|---|
| CN | 2675799 | 2/2005 |
| CN | 2675802 | 2/2005 |
| CN | 2680791 | 2/2005 |
| DE | 202004002706 | 5/2004 |
| DE | 202004003813 | 5/2004 |
| DE | 100 56 119 B4 | 12/2005 |
| GB | 1531951 | 11/1978 |
| GB | 2122283 | 1/1984 |
| GB | 2229220 | 9/1990 |
| TW | 0220911 | 8/1991 |
| TW | 0220910 | 3/1992 |
| TW | 022482 | 9/1992 |
| TW | 0220912 | 4/1994 |
| TW | 553286 | 9/2003 |
| WO | 89/11577 | 11/1989 |
| WO | 90/15910 | 12/1990 |

OTHER PUBLICATIONS

International Search Report and Written Opinion from International Application No. PCT/US2012/064368, mailed Feb. 3, 2013.

* cited by examiner

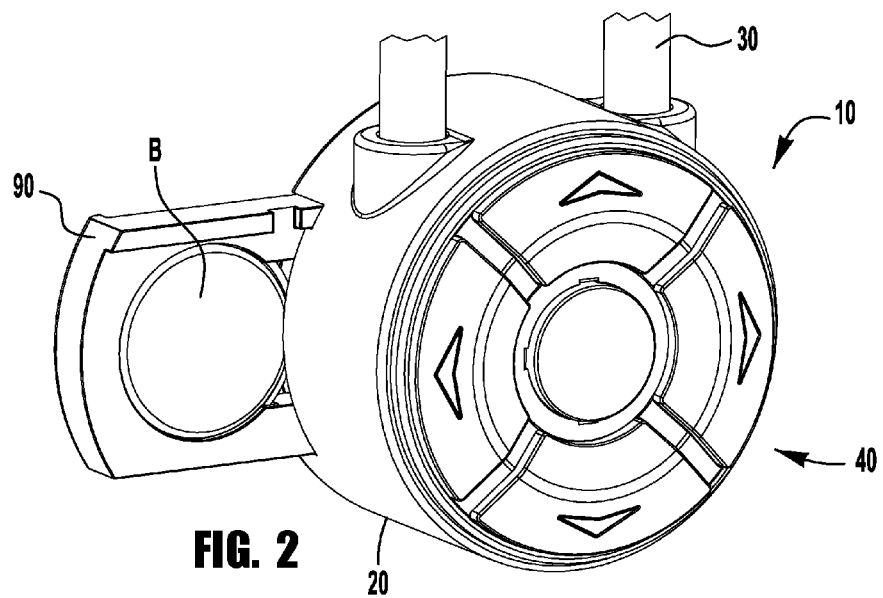
FIG. 2
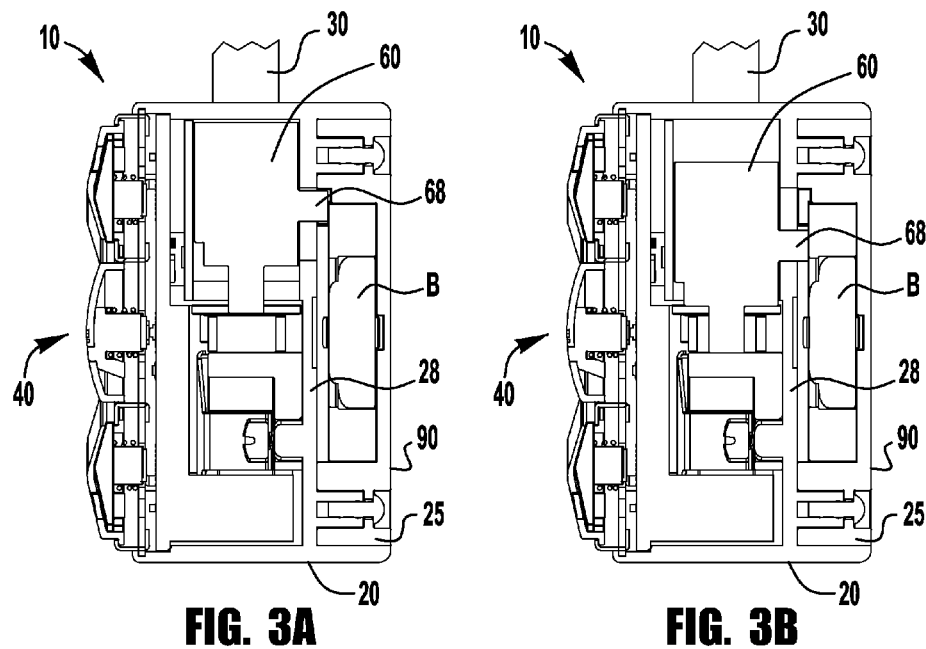
FIG. 3A   FIG. 3B

BATTERY ACCESS AND POWER SUPPLY ARRANGEMENTS

CROSS-REFERENCE TO RELATED APPLICATION

This application claims the benefit of and priority to U.S. Provisional Patent Application Ser. No. 61/558,655, entitled "BATTERY ACCESS AND POWER SUPPLY ARRANGEMENTS" and filed Nov. 11, 2011, the entire disclosure of which is incorporated herein by reference, to the extent that it is not conflicting with the present application.

BACKGROUND

Electronic locking arrangements, such as electronic keypads, may be used in a variety of locks, including, for example, padlocks, locker locks, safes, and lock boxes. The use of an electronic locking mechanism may facilitate access code or key (e.g., electronic key card) changes, the use of multiple access codes or keys, and the ability to store and audit past access events. For a portable electronic lock, the limited available power supply of an internal battery or batteries may present the risk of compromised security where the lock is configured to fail in the unlocked condition when the battery is depleted, or the need to destroy the lock (e.g., cut through the shackle or locking door) where the lock is configured to fail in the locked condition when the battery is depleted.

SUMMARY

In an exemplary embodiment of the present application, battery operated device includes a housing, an operating mechanism and an internal battery disposed within the housing, and an access member assembled with the housing and movable between first and second positions. The operating mechanism includes first and second sets of electrical contacts for transmitting power to the operating mechanism, with the internal battery being electrically connectable with the first set of electrical contacts for powering the operating mechanism. The access member is movable between a first position blocking external access to the second set of electrical contacts and connecting the first set of electrical contacts to the internal battery, and a second position permitting external access to the second set of electrical contacts and disconnecting the internal battery from the first set of electrical contacts.

In another exemplary embodiment of the present application, a battery operated device includes a housing, an operating mechanism and an internal battery disposed within the housing, and an access member assembled with the housing. The operating mechanism includes first and second sets of electrical contacts for transmitting power to the operating mechanism. The internal battery is electrically connected with the first set of electrical contacts for powering the operating mechanism. The access member is movable between a first position blocking external access to the internal battery and blocking external access to the second set of electrical contacts, a second position blocking external access to the internal battery and permitting external access to the second set of electrical contacts, and a third position permitting external access to the internal battery for replacement of the internal battery.

In yet another exemplary embodiment of the present application, an electronic padlock includes a lock body, a shackle assembled with the lock body and movable between locked and unlocked positions, an electronic lock interface and an access member assembled with the lock body, and an electromechanical locking mechanism and an internal battery disposed within the lock body. The electromechanical locking mechanism is operable to permit movement of the shackle from the locked position to the unlocked position in response to proper user manipulation of the electronic lock interface. The electromechanical locking mechanism includes first and second sets of electrical contacts for transmitting power to the operating mechanism. The internal battery is disposed within the lock body and electrically connected with the electromechanical locking mechanism by the first set of electrical contacts. The access member is movable between a first position blocking external access to the internal battery and blocking external access to the second set of electrical contacts, a second position blocking external access to the internal battery and permitting external access to the second set of electrical contacts, and a third position permitting external access to the internal battery for replacement of the internal battery.

BRIEF DESCRIPTION OF THE DRAWINGS

Further features and advantages will become apparent from the following detailed description made with reference to the accompanying drawing, wherein:

FIG. 2 is a partial front perspective view of an electronic padlock, shown with the battery access member in the battery replacement position, according to an exemplary embodiment;

FIG. 3A is a partial side cross-sectional view of the padlock of FIG. 2, shown with the blocker in the locked condition;

FIG. 3B is a partial side cross-sectional view of the padlock of FIG. 2, shown with the blocker in the unlocked condition;

DETAILED DESCRIPTION

Figure 1A:
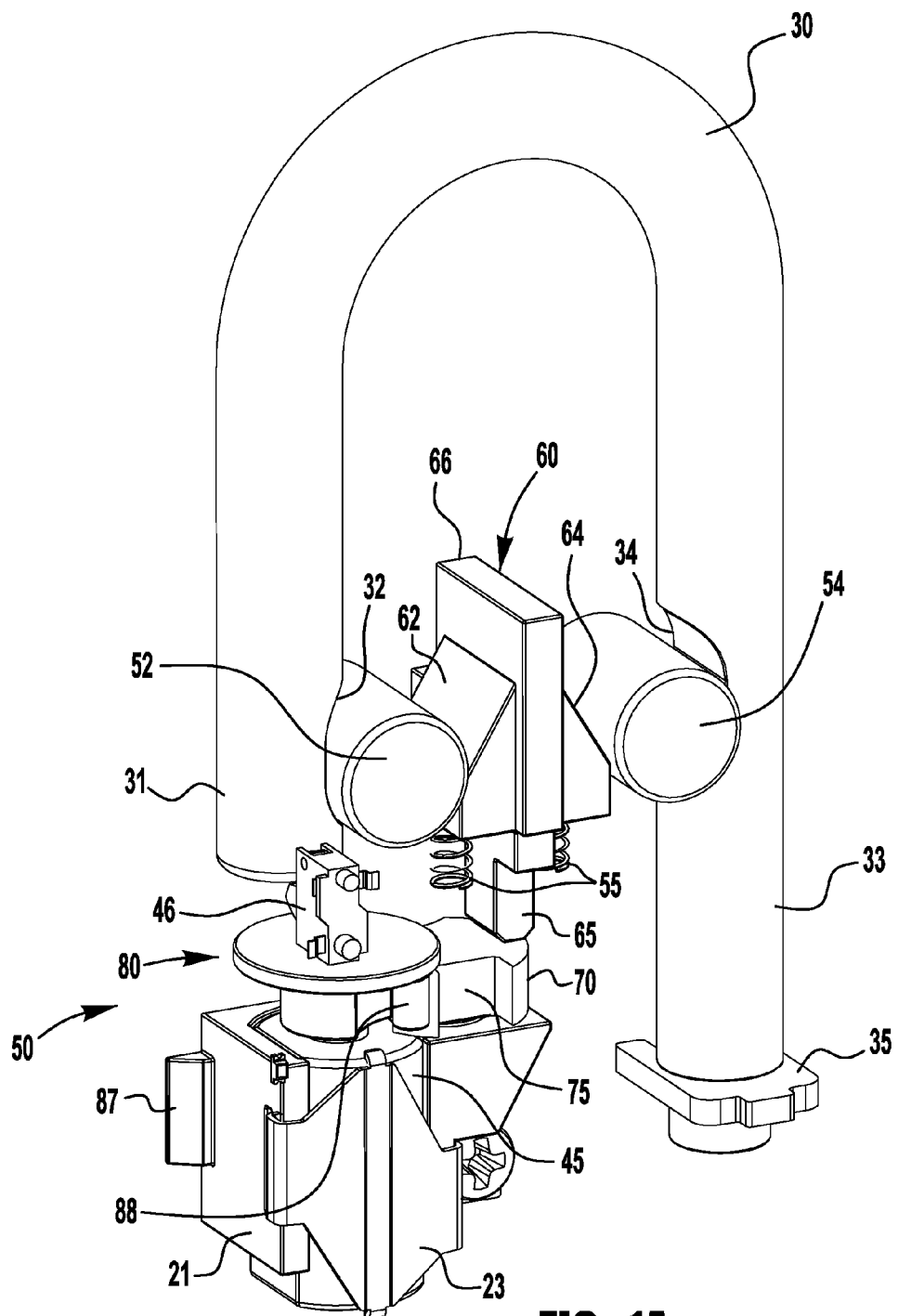
FIG. 1A is a perspective view of a shackle and internal locking mechanism of an electronic padlock, shown with the latch cam and driver in the locked condition, according to an exemplary embodiment.

This Detailed Description merely describes exemplary embodiments and is not intended to limit the scope of the specification or claims in any way. Indeed, the invention as claimed is broader than and unlimited by the exemplary embodiments, and the terms used in the claims have their full ordinary meaning.

Also, while the specific exemplary embodiments described in the specification and illustrated in the drawings relate to electronic keypad operated combination padlocks, it should be understood that many of the inventive features described herein may also be applied to other types of electronic locks, including, for example, electronic locker locks, safes, and lock boxes, and other types of battery operated electronic devices.

Figure 1B:
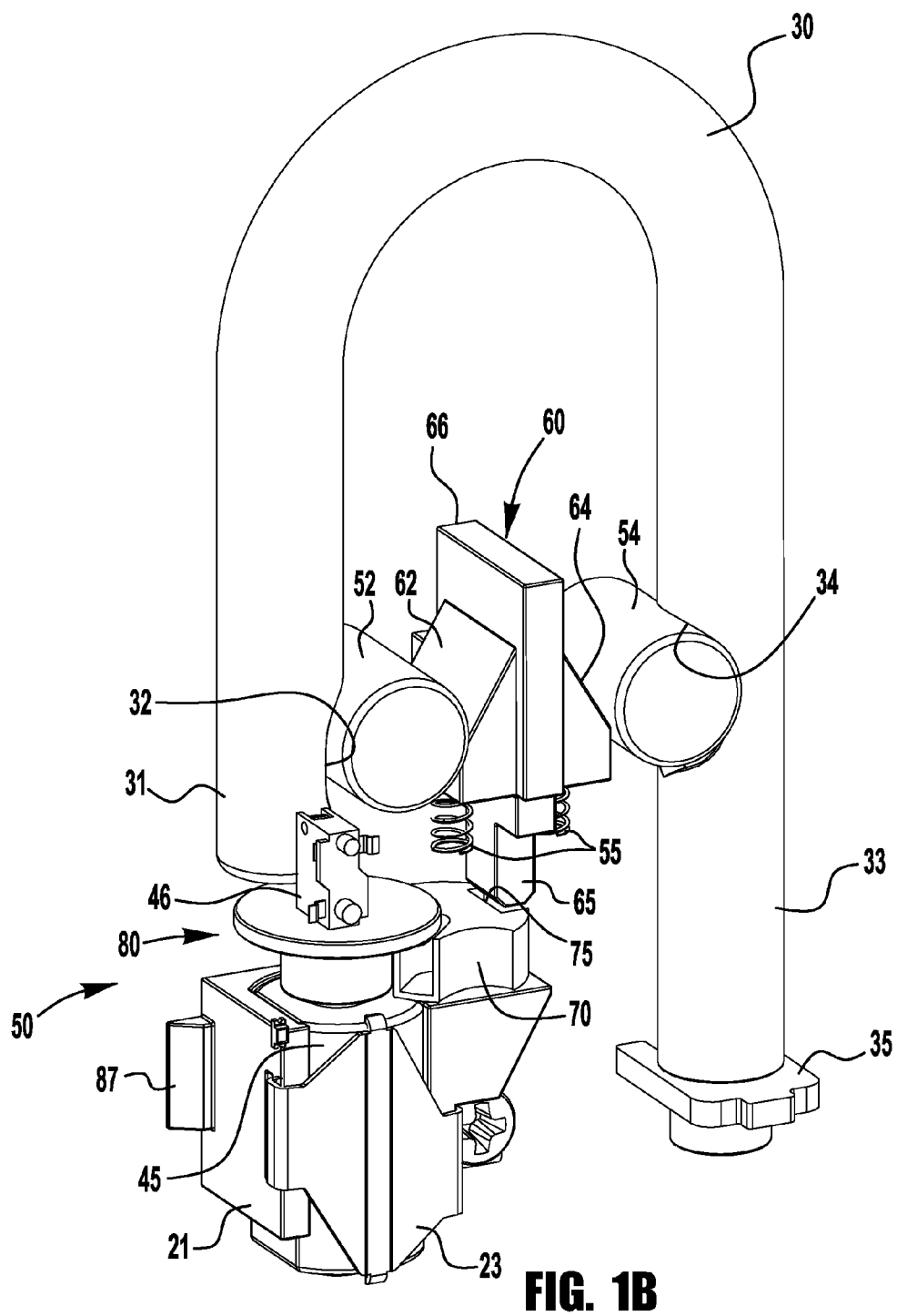
FIG. 1B is a perspective view of the shackle and internal locking mechanism of FIG. 1A, shown with the latch cam and driver in the unlocked condition.
Figure 1C:
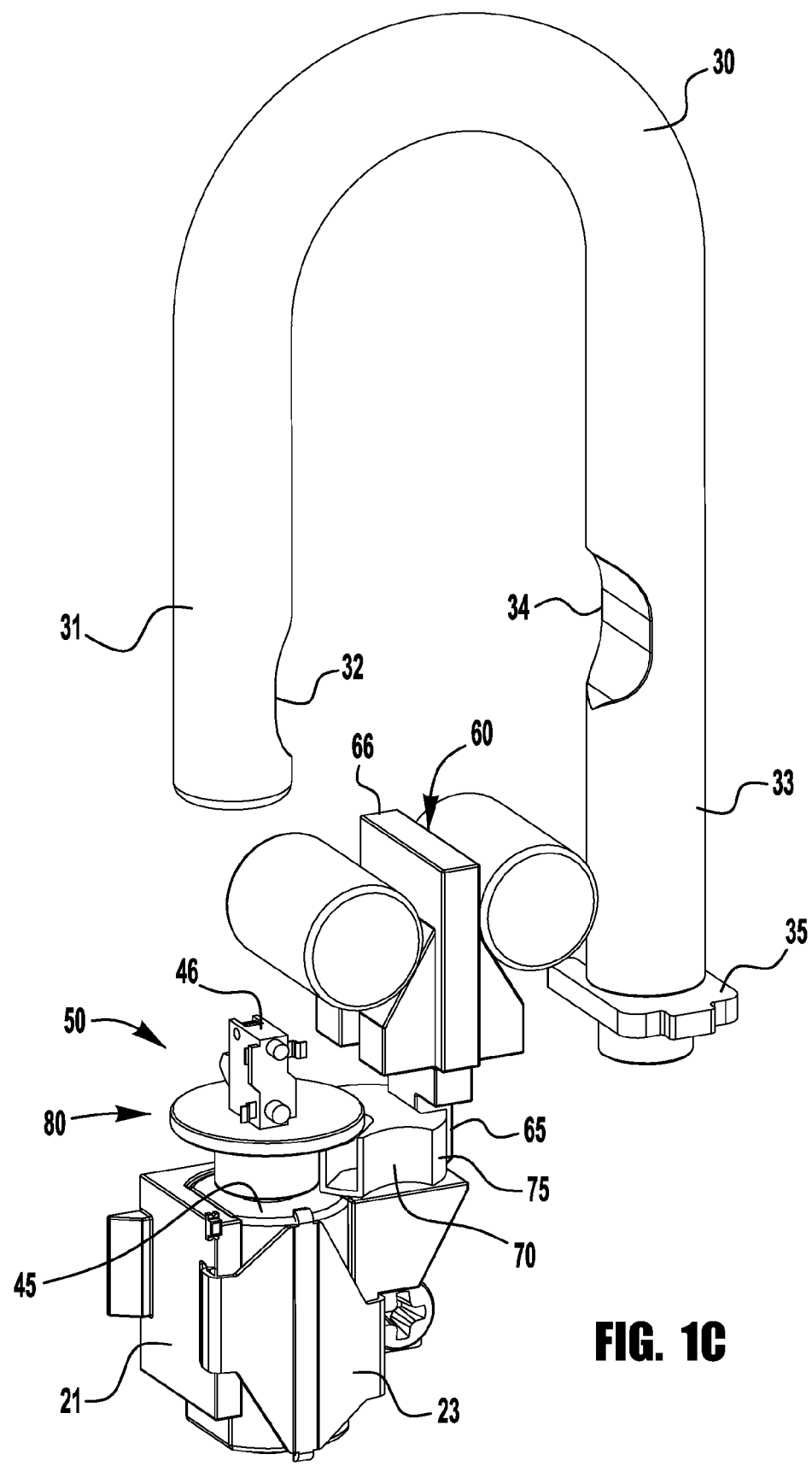
FIG. 1C is a perspective view of the shackle and internal locking mechanism of FIG. 1A, shown with the latch cam and driver in the unlocked condition and the shackle pulled to the withdrawn condition.

Battery operated devices, such as, for example, electronic padlocks, may be configured to restrict access to the internal battery, such that unauthorized removal of the battery (and disabling of one or more electronic or electromechanical functions of the device) may be prevented. As one example, an electronic lock (e.g., a padlock) may be configured such that a battery access member (e.g., a door, drawer, or cover) of the lock is secured in a closed position when the lock's access restricting structure (e.g., a shackle, latch, locking pin, locking cable, or locking bolt) is in the locked position. When the access restricting structure is in the unlocked or open position, the battery access member is movable to an open position for removal or replacement of the internal battery. One example of an electronic padlock with a securable battery access member is described in co-pending U.S. application Ser. No. 13/183,573 (the "'573 application"), entitled "Padlock" and filed on Jul. 15, 2011, the entire disclosure of which is incorporated herein by reference in full. In the '573 application, as shown in FIGS. 1A-1C, an electronic padlock 10 includes a blocker 60 with an extension or post 65 that abuts against a latch cam 70 when the locking mechanism 50 is in the locked condition, thereby preventing axial movement of the blocker 60 for secure retention of a shackle 30 in a locked position with the lock body 20. When the exemplary latch cam 70 is rotated to an unlocked condition by a motor 45 and driver cam 80, a gap or cutout 75 in the latch cam 70 aligns with the post 65 to permit axial movement of the blocker 60. In this unlocked condition, when the shackle 30 is axially pulled in an opening or withdrawing direction, a laterally inward force is directed from the shackle notches 32, 34 through the locking members 52, 54 to tapered camming surfaces 62, 64 of the blocker 60. These laterally inward forces against the tapered camming surfaces 62, 64 move the blocker 60 axially downward against springs 55, such that the post 65 is received in the cutout 75. In this axially downward position, laterally inward forces on the locking members 52, 54 (from pulling on the shackle 30) push the locking members laterally inward against a necked down portion 66 of the blocker 60, and out of engagement with the shackle notches 32, 34, thereby allowing the shackle 30 to be withdrawn to a disengaged or open position.

As shown in FIGS. 2, 3A, and 3B, the motor 45 of the padlock 10 of the '573 Application is powered by a battery B that is removable by sliding a battery drawer or compartment 90 to a open position. To prevent theft or unauthorized removal of the battery B from the locked padlock 10, the blocker 60 may be provided with a projection 68 or other such battery access latch that interlocks with a notch 98 in a battery compartment 90 when the blocker 60 is in the locked or shackle engaging condition (FIG. 3A), such that sliding movement of the compartment 90 is prevented. When the padlock 10 is unlocked and the blocker 60 is moved to the unlocked condition (FIG. 3B), the projection 68 disengages from the notch 98 in the compartment 90 to allow sliding movement of the compartment 90 to an open condition.

Figure 4:
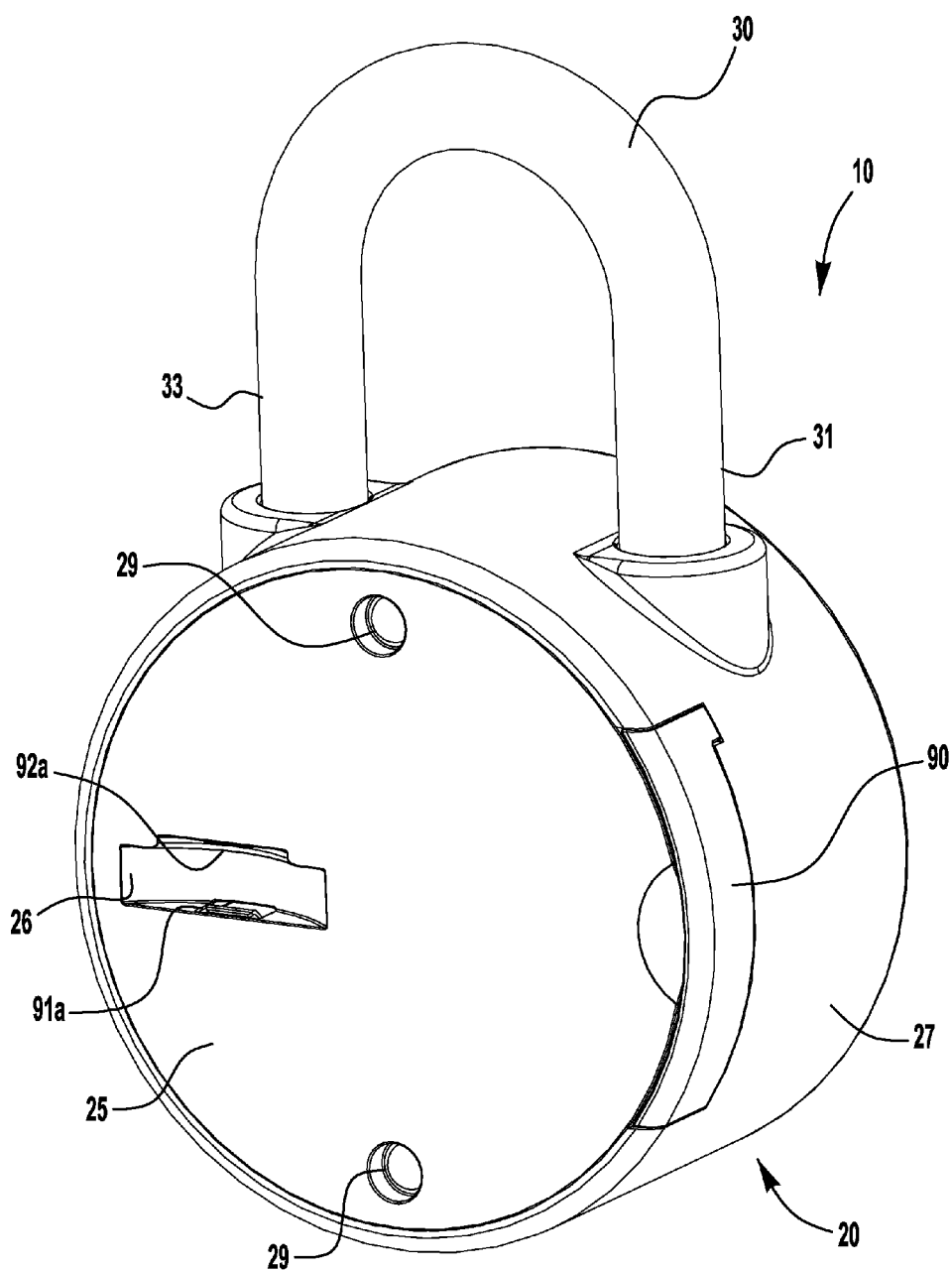
FIG. 4 is a rear perspective view of the padlock of FIG. 2.
Figure 5:
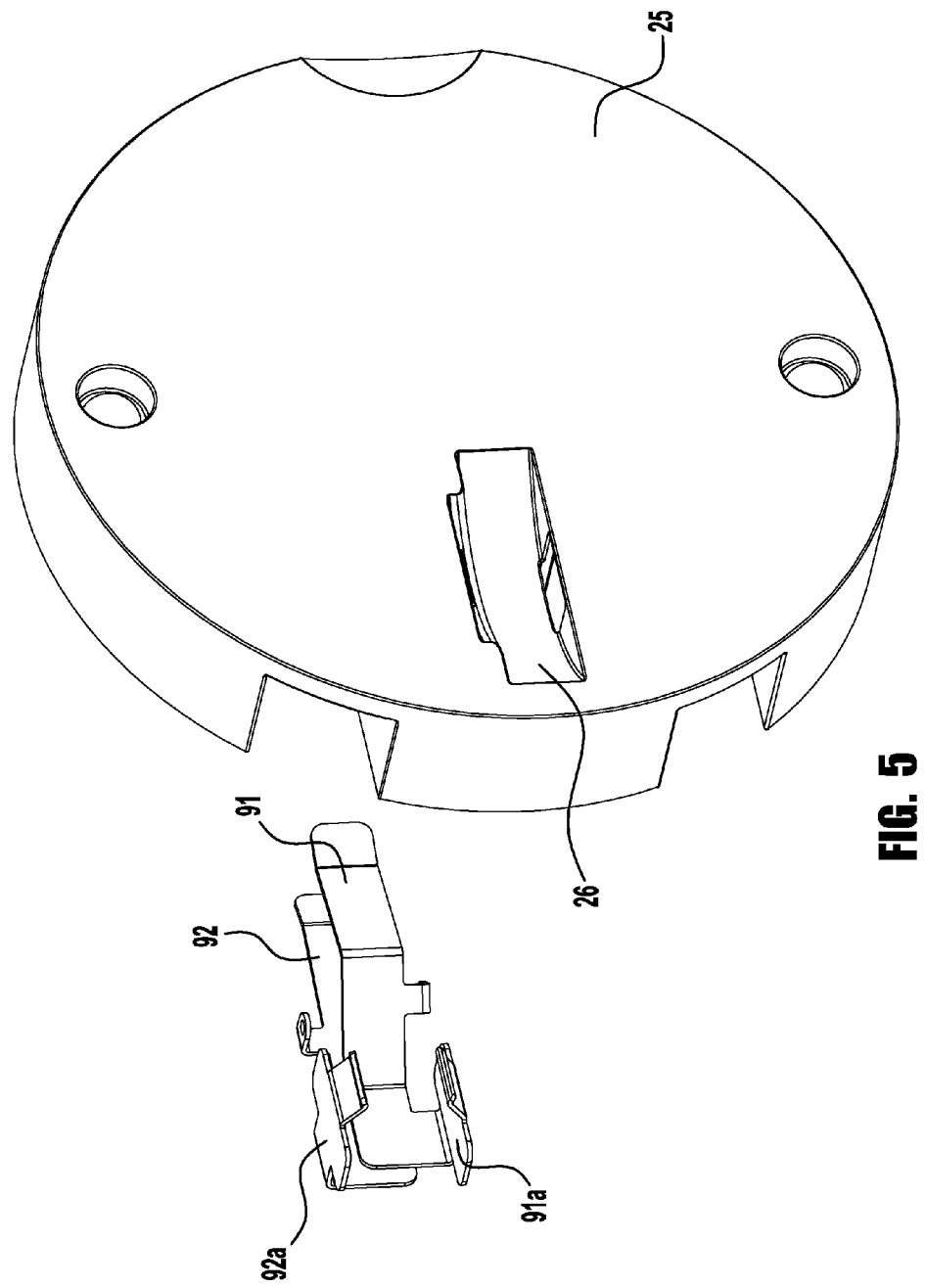
FIG. 5 is a rear exploded perspective view of the back plate and electrical contacts of the padlock of FIG. 2.
Figure 6:
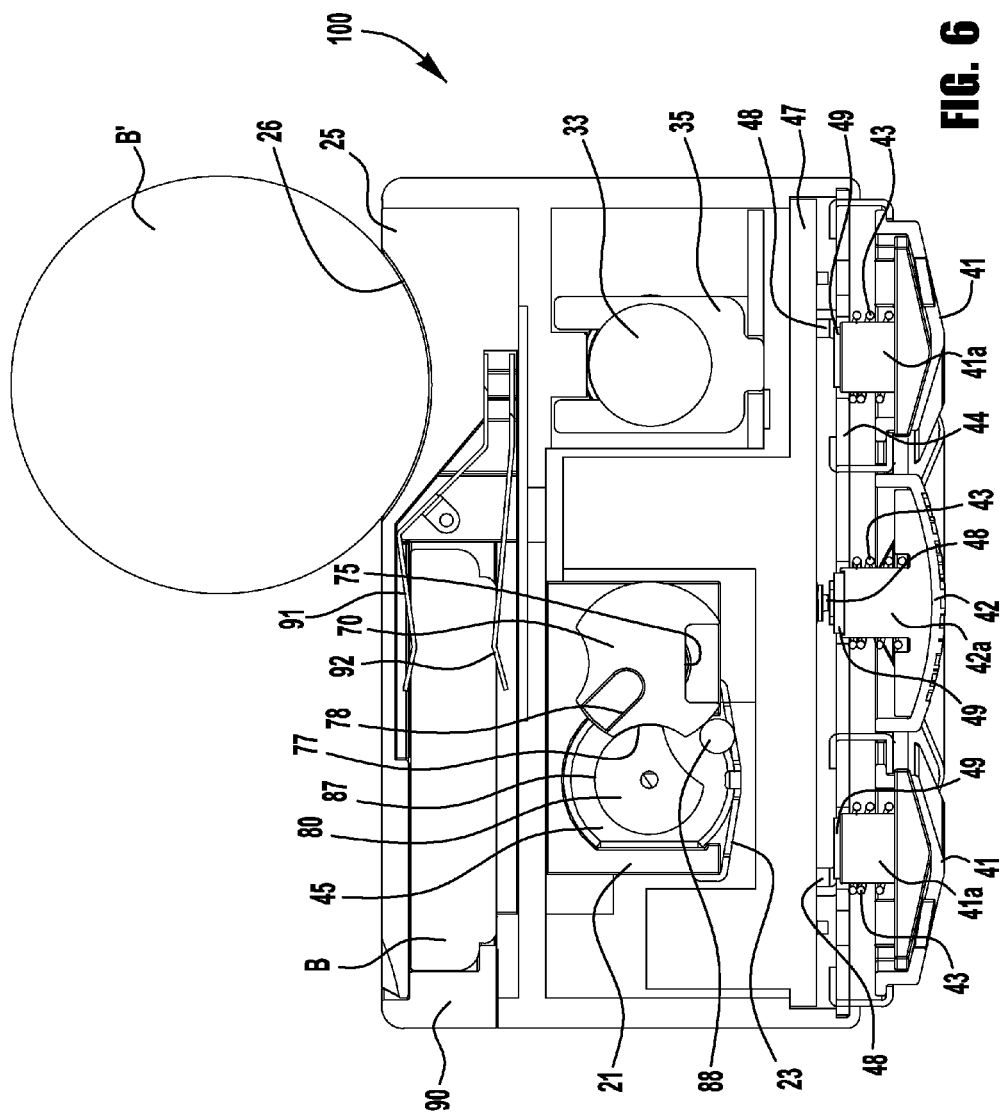
FIG. 6 is an upper cross-sectional view of the padlock of FIG. 2, shown with a spare battery engaged with the padlock to power the padlock.

As shown in FIGS. 4, 5, and 6, the exemplary padlock 10 of the '573 Application is configured to allow for external power supply to the locking mechanism, for example, in the event of a depleted battery. Battery contacts 91, 92 for the internal battery B include flange portions 91a, 92a or other such extensions that extend through the back plate 25 of the lock body 20, for engagement with a spare battery B' (see FIG. 5). As shown in FIGS. 4-6, the back plate 25 of the lock body 20 may be provided with an arcuate recess 26 sized to closely receive the spare battery B' with the battery contact flanges 91a, 92a positioned to engage the inserted spare battery B'. When the spare battery B' has been inserted and the externally powered padlock 10 has been unlocked, the battery compartment 90 may be withdrawn to replace the depleted battery B with the spare battery B'.

External battery contacts on an electronic padlock or other battery powered electronic device may be susceptible to corrosion or contamination. Further, engagement of a spare battery or other objects with the battery contacts when the internal battery still has a substantial charge may result in a short circuit of the device, damaging or disabling the device.

Accordingly, the present application contemplates a battery operated electronic device, such as an electronic lock, configured to protect external battery "jump" contacts of the device, for example, to prevent corrosion of the contacts or to prevent the electrical connection of a spare battery or other objects with the device while a charged internal battery remains electrically connected with the device.

In one embodiment, an electronic device is provided with external battery jump contacts that are protected and/or made inaccessible (e.g., connection of a spare battery with the contacts is blocked) by a movable battery access member (which may, but need not, be a battery door or battery compartment). When the battery access member is moved to an external jump position, such that a spare battery may be connected with the contacts, the device is configured to disengage the internal battery from a battery powered mechanism of the device (e.g., an electromechanical locking mechanism), thereby preventing the electrical connection of the device's battery powered mechanism with two charged batteries (i.e., the internal battery and the spare battery) simultaneously, to prevent a short circuit in the device.

Figure 7A:
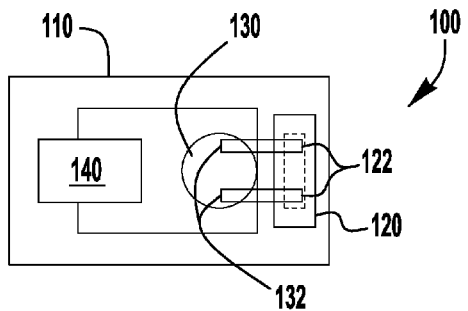
FIG. 7A is a schematic view of an exemplary battery powered electronic device, shown with the battery access member in an access blocking position, according to an exemplary embodiment.
Figure 7B:
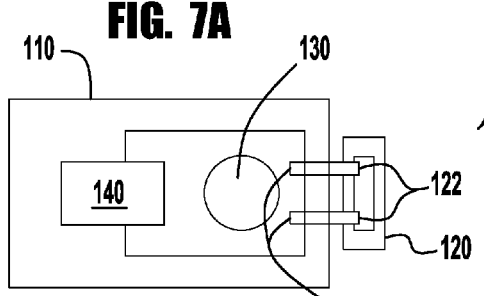
FIG. 7B is a schematic view of the electronic device of FIG. 7A, shown with the battery access member in an external battery jump position.

FIGS. 7A and 7B schematically illustrate a battery powered device 100 having a battery access member 120 that is movable between at least two positions: a battery access blocking first position (shown in FIG. 7A), and an external battery jump second position (FIG. 7B). In the battery access blocking position, external battery jump contacts 122 are covered or otherwise blocked from external access (e.g., enclosed within device housing 110), and an internal battery 130 is electrically connected with an internal battery powered mechanism 140 by a first set of electrical contacts (or internal battery contacts) 132 to operate the mechanism 140. When the battery access member 120 is moved to the external battery jump position, the external battery jump contacts (or second set of electrical contacts) 122 are exposed and accessible (e.g., extending outward of the device housing 110 or uncovered by the battery access member 120) for connection with an external battery (not shown), and the internal battery contacts 132 are disconnected from the internal battery 130 to prevent simultaneous connection of the battery powered mechanism 140 with both the internal and external batteries.

Figure 8A:
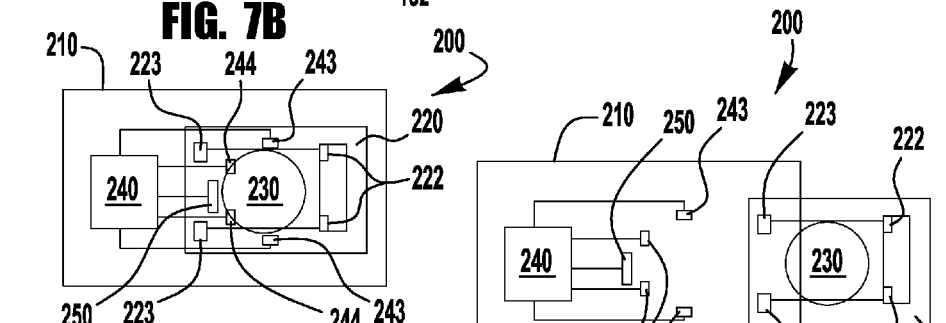
FIG. 8A is a schematic view of another exemplary battery powered electronic device, shown with the battery access member in an access blocking position, according to an exemplary embodiment.
Figure 8C:
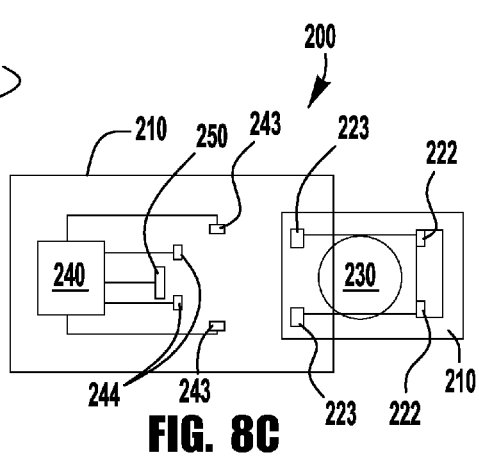
FIG. 8C is a schematic view of the electronic device of FIG. 8A, shown with the battery access member in a battery replacement position.
Figure 8B:
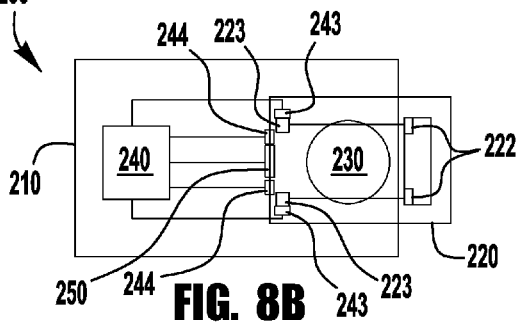
FIG. 8B is a schematic view of the electronic device of FIG. 8A, shown with the battery access member in an external battery jump position.

While movement of the battery access member to the external battery jump position may move battery contacts to disengage the internal battery, in another embodiment, movement of the battery access member to the external battery jump position may move the internal battery itself to disengage from the battery contacts and the battery powered mechanism. FIGS. 8A and 8B schematically illustrate a battery powered device 200 having a battery access member 220 that is movable between at least two positions: a battery access blocking first position (shown in FIG. 8A), in which access to the external battery jump contacts 222 is blocked (e.g., disposed within the device housing 210), and an external battery jump second position (FIG. 8B), in which the external battery jump contacts 222 are accessible (e.g., extending outward of the device housing 210 or uncovered by the battery access member 220). In the illustrated example, the battery access member 220 retains the internal battery 230, such that movement of the battery access member 220 to the external battery jump position moves the battery 230 out of engagement with electrical contacts 244, and moves the external battery jump contacts 222 into electrical connection with electrical contacts 243.

According to another aspect of the present application, a battery operated device may be configured such that when a battery access member is in an access blocking position, a first circuit is established between an internal battery and conductive members (e.g., contact pads on a printed circuit board) electrically connected with a motor or other electrical operating component to selectively power the electrical operating component. When the battery access member is in an external battery jump position, the first circuit is broken and a second circuit is established between external jump contacts and conductive members (e.g., contact pads on a printed circuit board) electrically connected with the electrical operating component to selectively power the electrical operating component upon connection of an external battery with the jump contacts. In the illustrated schematic of FIGS. 8A and 8B, a first circuit is established between the battery 230, electrical contacts 244, and battery powered mechanism 240 when the battery access member 220 is in the access blocking position (FIG. 8A), and a second circuit is established between an external "jump" battery (not shown) and the battery jump contacts 222, electrical contacts 243, and battery powered mechanism 240 when the battery access member 220 is in the external jump position (FIG. 8B) when the external battery is connected with the battery jump contacts 222. The second circuit may be configured to include circuit protecting components, such as, for example, reverse battery and over-voltage protection components, to protect the device from unintentional or malicious application of excessive voltage or current to the device through the jump contacts. The use of separate circuit paths for the internal battery power supply and the jump battery power supply may prevent an excessive voltage drop or power drain of the internal battery resulting from continuous use of these protective components during normal operation of the device.

According to still another aspect of the present application, a battery access member, in addition to being movable to access blocking and external jump positions, as described above, may also be movable to a third, battery replacement position, in which the internal battery of the device may be removed or replaced. As one example, as shown schematically in FIG. 8C, the battery access member 220 may be moved beyond the external battery jump position (FIG. 8B) to a battery replacement position, in which the internal battery 230 may be withdrawn from the device housing 210 or otherwise uncovered for removal and replacement. To prevent unauthorized removal of the internal battery 230, the battery powered mechanism may be connected (electrically or mechanically) with a mechanical or electromechanical latch member 250 which secures the battery access member 220 against movement to the battery replacement position. In an exemplary embodiment, authorized operation of the battery powered mechanism 240 (e.g., entry of a secure access code on an electronic keypad) may allow the latch member 250 to release the battery access member 220 for movement to the battery replacement position. This authorized operation of the battery powered mechanism 240 may be powered by the internal battery 230 or by an external battery connected with the jump contacts 222 when the battery access member 220 is in the external jump position. In other embodiments (not shown), a battery access door securable by a latch member may be provided as a separate component from an external jump access member.

Figure 9A:
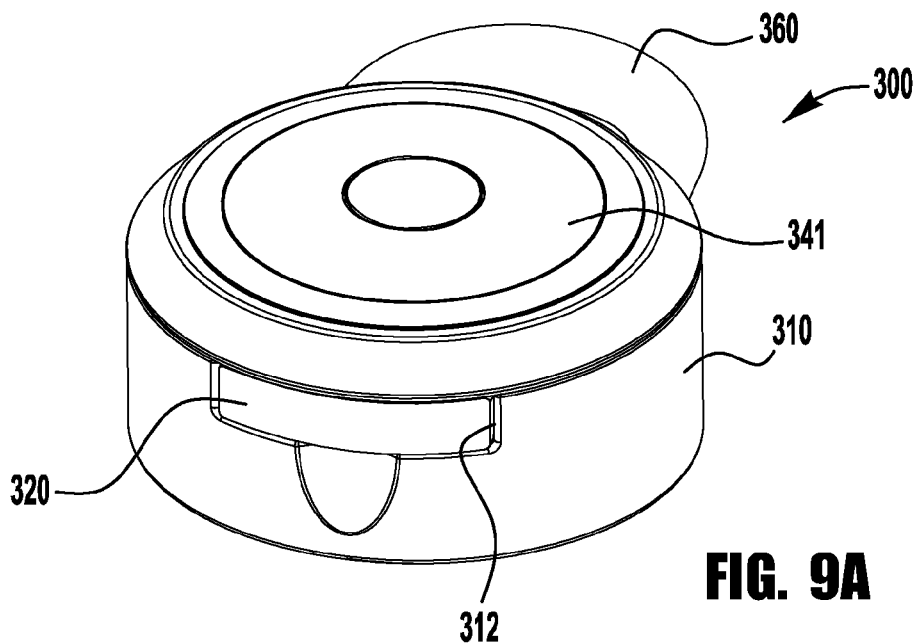
FIG. 9A is a perspective view of an exemplary electronic padlock, shown with the battery access drawer in a closed position, according to an exemplary embodiment.
Figure 9B:
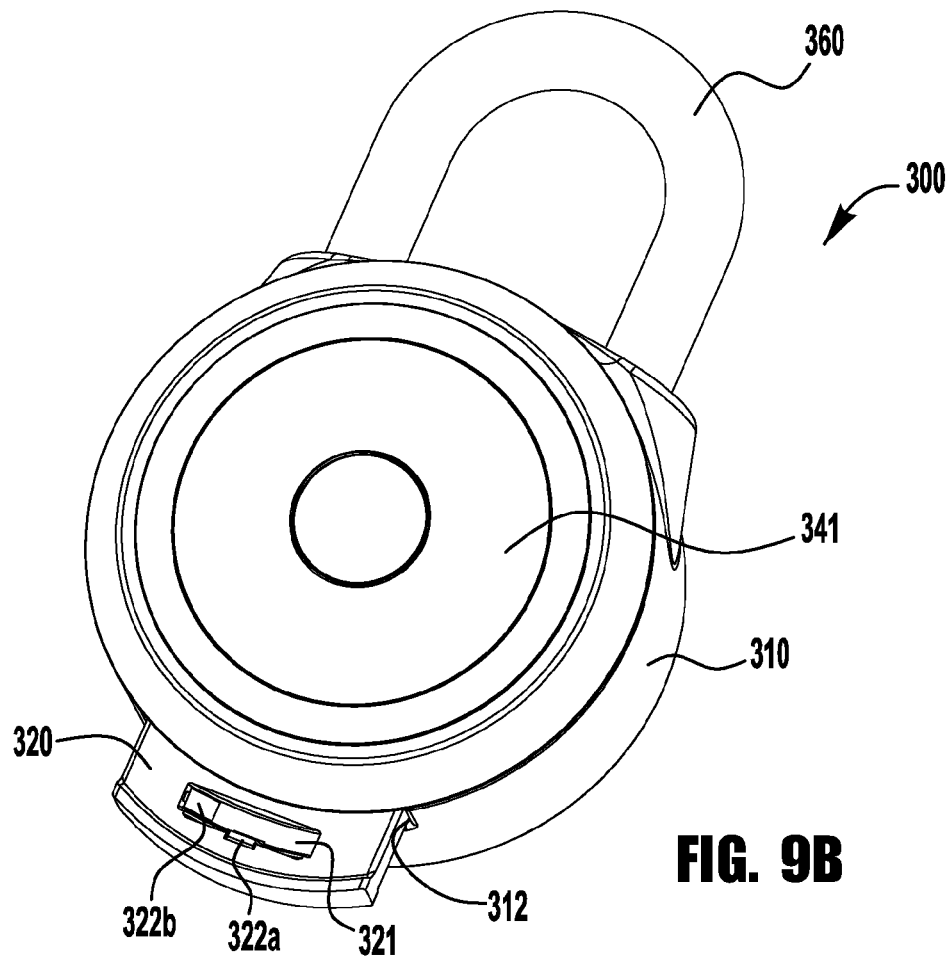
FIG. 9B is a perspective view of the electronic padlock of FIG. 9A, shown with the battery access drawer in an external battery jump position.
Figure 9C:
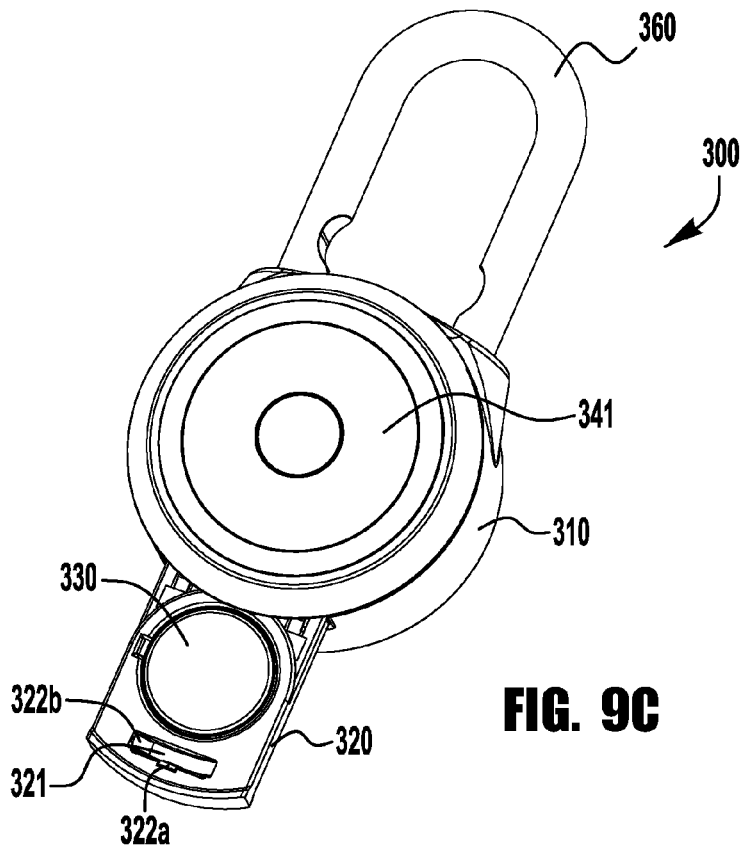
FIG. 9C is a perspective view of the electronic padlock of FIG. 9A, shown with the battery access drawer in an open, battery replacement position.
Figure 12A:
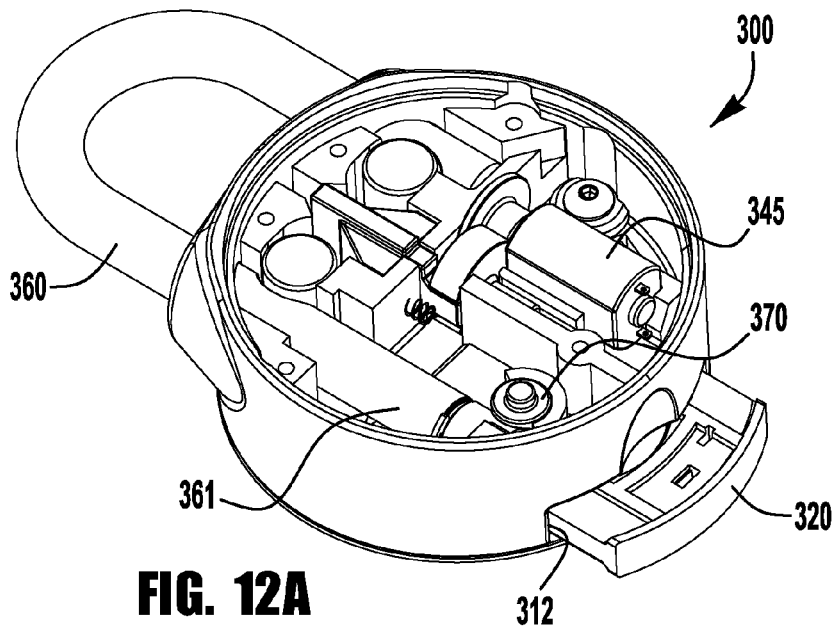
FIG. 12A is a rear perspective view of the electronic padlock of FIG. 9A, with the back plate removed to illustrate additional features of the lock.
Figure 10A:
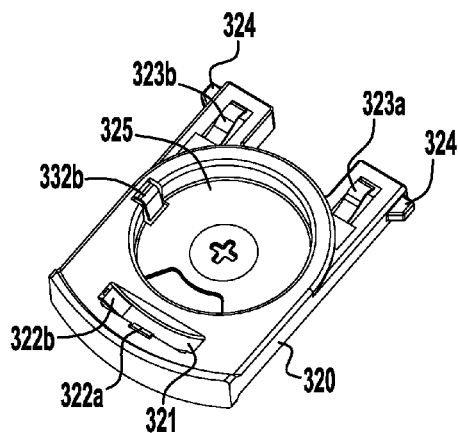
FIG. 10A is a perspective view of the battery access drawer of the electronic padlock of FIG. 9A.

FIGS. 9A-9C illustrate an exemplary electronic combination padlock 300 having an electronic keypad 341 disposed on a front face of the lock body 310. The padlock 300 includes a shackle 360 selectively secured to the lock body 310 by an electromechanical locking mechanism disposed within the lock body 310. The locking mechanism is powered by an internal battery 330 (e.g., a coin cell-type battery) and is controlled by a printed circuit board (PCB) 347 (FIGS. 10B-10D) configured to receive and evaluate electronic signals from the keypad 341 corresponding to a sequence of keypad entries, and deliver an electrical authorization signal to a motor 345 to unlock the locking mechanism. As shown, the locking mechanism may, but need not, be consistent with the motor driven locking mechanism described in the above incorporated '573 application.

As shown, the padlock 300 includes a battery access drawer 320 received in an opening 312 in the lock body 310 and movable between three positions, a closed or battery access blocking position (FIG. 9A), in which access to both the internal battery 330 and jump contacts 322a, 322b (FIG. 9B) is blocked; a partially open or external battery jump position (FIG. 9B), in which the jump contacts 322a, 322b are accessible for connection with an external battery (not shown), for powering the padlock, and a fully open or battery replacement position (FIG. 9C), in which at least the internal battery 330 is accessible, for removal and/or replacement of the battery 330. The battery access drawer 320 may include side tabs 324 (FIG. 10A) that ride in corresponding slots (not shown) in the lock body 310 to guide movement of the drawer 320. Additionally, the drawer 320 may be provided with a detent engagement with the lock body 310 to releasably secure the drawer in the closed position.

Figure 10B:
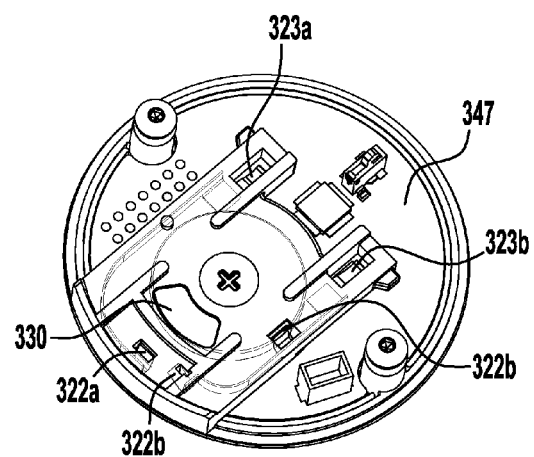
FIG. 10B is a perspective view of the battery circuit connection arrangement of the electronic padlock of FIG. 9A, shown with the battery access drawer in a closed position.
Figure 10C:
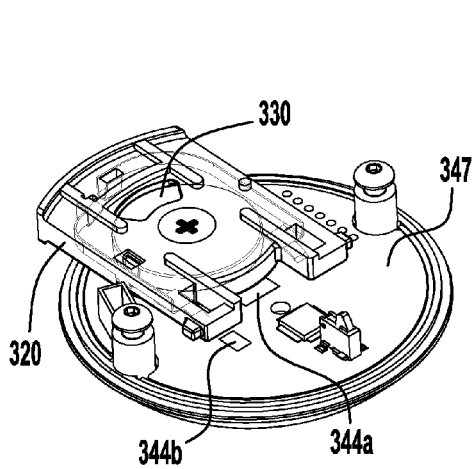
FIG. 10C is a perspective view of the battery circuit connection arrangement of the electronic padlock of FIG. 9A, shown with the battery access drawer in a partially open position.
Figure 10D:
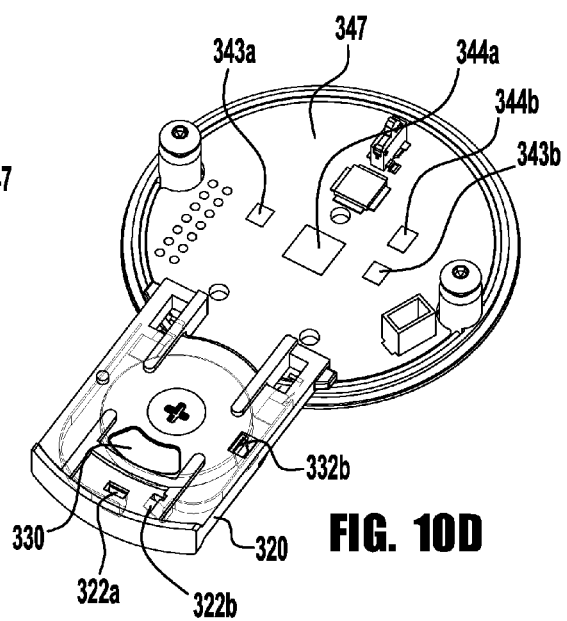
FIG. 10D is a perspective view of the battery circuit connection arrangement of the electronic padlock of FIG. 9A, shown with the battery access drawer in a fully open position.

As shown, the jump contacts 322a, 322b may be disposed in a recess 321 sized and shaped to receive a properly oriented external jump battery, which may, but need not, be identical to the internal battery 330. In other embodiments (not shown), an electrical port may be provided (in addition to or instead of battery jump contacts) to connect an AC adapter or other such external power supply to power the lock. In the illustrated embodiment, as shown in FIGS. 10A-10D, the jump contacts 322a, 322b extend to spring biased PCB engaging ends 323a, 323b. An internal battery contact 332b is connected with the positive PCB engaging end 323b to provide a common positive contact. The internal battery 330 is oriented in a recess 325 in the battery access drawer 320 to directly engage a conductive surface of the battery 330 with the PCB 347. As shown in FIG. 10B, when the battery access drawer 320 is in the closed or access blocking position (also shown in FIG. 9A), a first circuit is established between the battery 330 and electrical contact pads 344a, 344b on the PCB 347, for electrical connection with the motor 345 to selectively power the motor when an authorized access code is entered on the keypad 341. When the battery access drawer 320 is in the partially open or external battery jump position (FIGS. 9B and 10C), the first circuit is broken and a second circuit is established between circuit board contacts 343a, 343b, and the jump contacts 322a, 322b, and a spare or jump battery (not shown) may be connected with the jump contacts. When the battery access drawer 320 is in the fully open or battery replacement position (FIGS. 9C and 10D), both first and second circuits are broken.

Figure 11:
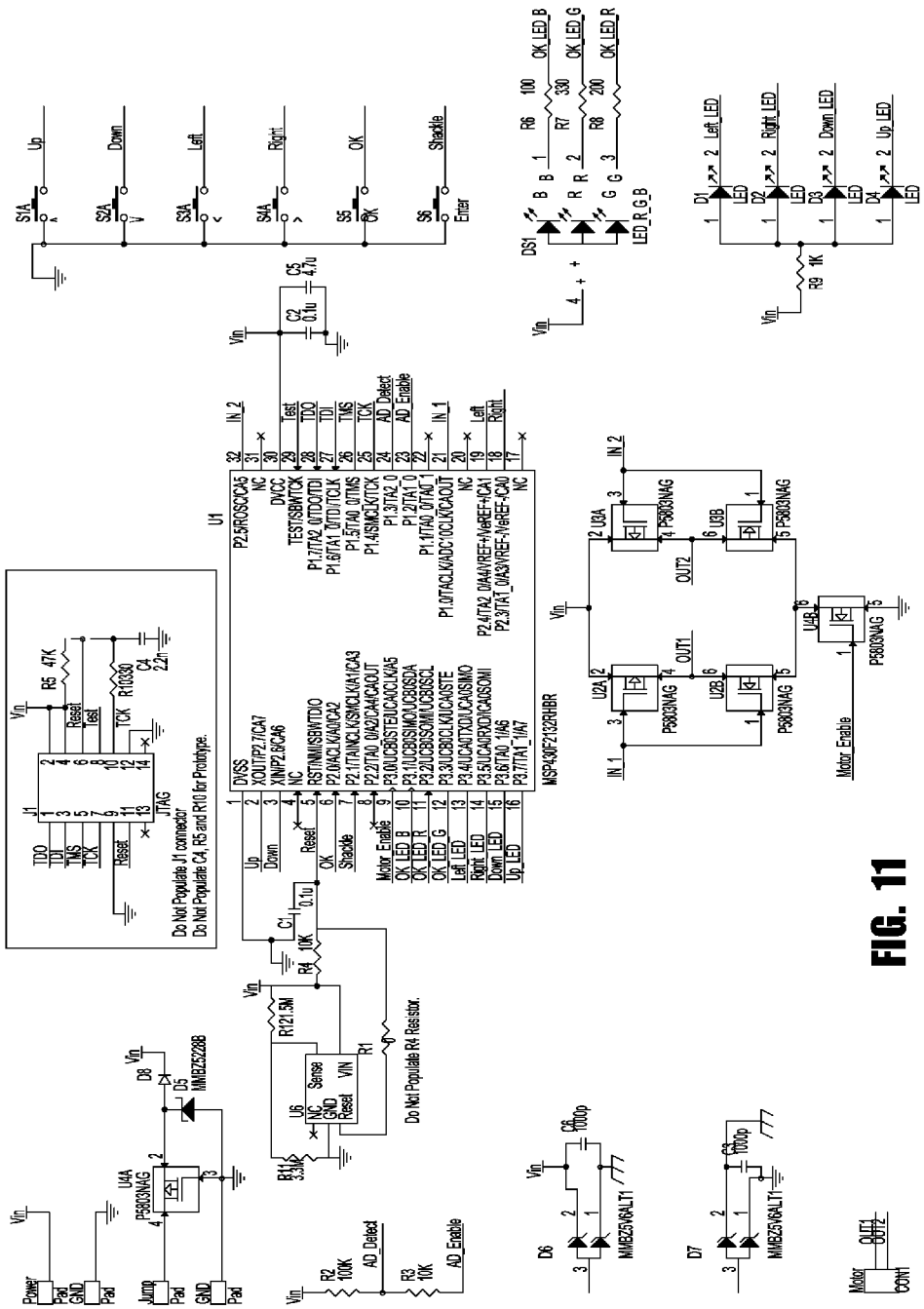
FIG. 11 includes schematic illustrations of exemplary wiring arrangements of the PC board of the electronic padlock of FIG. 9A.
Figure 12B:
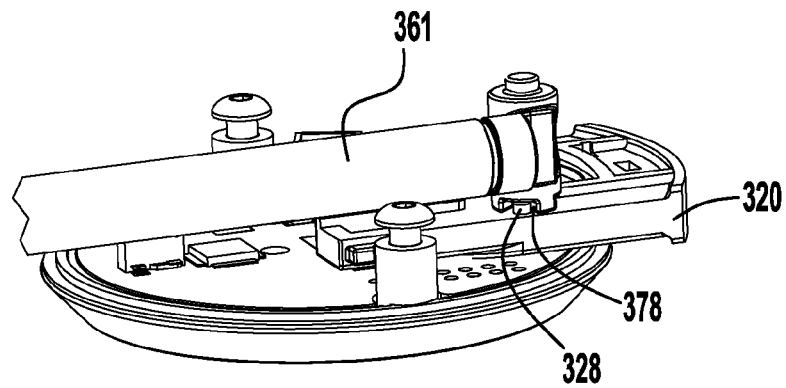
FIG. 12B is a perspective view of the battery drawer retention mechanism of the electronic padlock of FIG. 9A, shown with the battery access drawer in a partially open position and the shackle in a closed position.
Figure 12C:
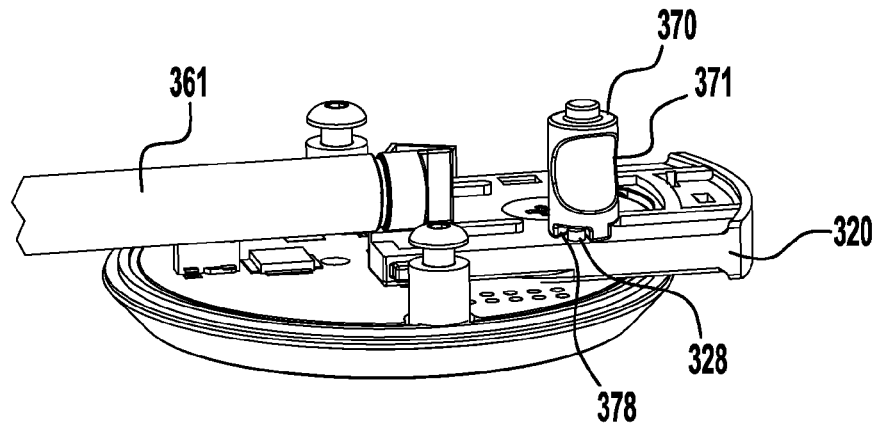
FIG. 12C is a perspective view of the battery drawer retention mechanism of the electronic padlock of FIG. 9A, shown with the battery access drawer in the partially open position and the shackle in an open position.
Figure 12D:
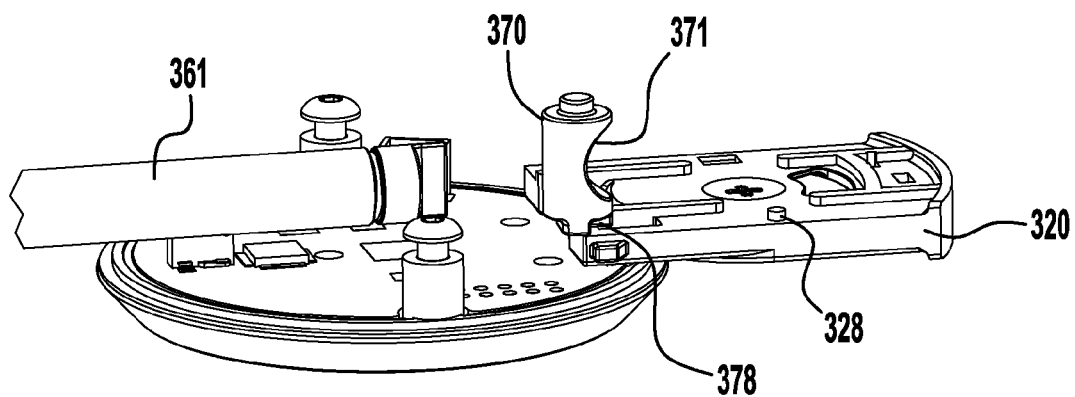
FIG. 12D is a perspective view of the battery drawer retention mechanism of the electronic padlock of FIG. 9A, shown with the battery access drawer in the fully open position and the shackle in the open position.

FIG. 11 includes circuit diagrams for exemplary circuitry on the PCB. As shown, the exemplary circuit completed by a jump battery connected with the jump contacts 322a, 322b includes multiple protective components, including a field effect transistor (FET) U4A and diode D8 for reverse battery protection and a Zener diode D5 for over-voltage protection (e.g., rated to dissipate voltages over 3.3 V to ground). In other embodiments, other protective components may be utilized, including, for example, a three terminal linear voltage regulator, and/or a common mode choke in series with the jump pad and a regulator and between a ground pad and PCB ground, with capacitors to chassis ground. The exemplary circuit completed by the internal battery 330 connected with the battery contact 332b may be provided without such protective components, to prevent the excessive voltage drop or power drain of the internal battery that may result from continuous use of these protective components, as the installation of a battery in the battery access drawer 320 of an unlocked padlock 300 is less likely to involve tampering or the inadvertent connection of an improperly sized battery. This circuit may however, be provided with one or more protective components, including, for example, a reset chip to protect from low voltage conditions locking the chip/padlock. Still other protective electrical components may be utilized in the lock, including, for example, surge protecting diodes D6, D7 and filter caps C6, C7 for case-to-battery and case-to-ground spikes.

As discussed above, an electronic padlock may be configured such that a battery access member is secured against movement to a battery replacement position when the lock is in the locked position (e.g., when the shackle is secured with the lock body). Many different mechanism may be utilized to secure the battery access member against movement to the battery replacement position. In one embodiment, as shown, for example, in the exemplary padlock of the '573 application and described above, a shackle securing component (e.g., a sliding blocker) may interlock with a battery access member (e.g., a battery access door or drawer) when the padlock is in a locked condition, with the shackle securing component disengaging from the battery access member when the lock is in an unlocked condition. In another embodiment, the shackle may directly or indirectly interlock with the battery access member when the shackle is secured with the lock body, with the shackle being disengaged from the battery access member when the padlock is unlocked and the shackle is withdrawn from the lock body. As one example, a spring loaded pin may be held in engagement with the battery access member in the external battery jump position when the shackle is secured with the lock body, and released from the battery access member for movement to the battery replacement position when the shackle is withdrawn from the lock body. As another example, a rotating cam disposed in the lock body may retain a projection of the battery access member in a first rotational position of the cam, and may release the projection for movement of the battery access member to the battery replacement position in a second rotational position of the cam. The closed shackle interlocks with the cam to hold the cam in the first rotational position, while the withdrawn shackle disengages from the cam to allow rotation to the second rotational position and release of the battery access member projection.

In the illustrated example shown in FIGS. 12A-12D, a battery drawer retention mechanism prevents movement of the battery drawer except when the shackle is opened, such that only authorized removal and/or replacement of the battery is permitted. The exemplary retention mechanism includes a rotating cam 370 having a cutout 371 that mates with the long leg 361 of the shackle 360 in a first rotational position of the cam 370 when the shackle is secured with the lock body 310. A projection 328 extending from the battery access drawer 320 engages a recessed base 378 of the cam 370. The mating engagement of the shackle 360 and the cam 370 prevents rotation of the cam and movement of the battery access drawer 320. When the shackle is withdrawn from the lock body 310, the shackle leg 361 disengages the cam 370, allowing the cam to rotate to a second rotational position to release the projection 328 such that the battery access drawer 320 may be pulled to the fully open or battery replacement position. When the battery access drawer 320 is manually pushed toward the closed or access blocking position, the projection 328 engages the recessed base 378 to rotate the cam 370, thereby realigning the cam cutout 371 with the long shackle leg 361 to allow the shackle to be returned to the locked condition.

In operation, when an exemplary battery powered device (e.g., electronic padlock) lacks sufficient power to operate (e.g., to open the lock), an access member is moved by the user from a first, access blocking position to a second, external jump position, in which a set of electrical contacts are externally accessible for contact with a spare battery or other power source. This provides power to a PCB within the device for entry of an authorized access code on the keypad. As described, movement of the access member to the second position may simultaneously disconnect the internal battery from an internal set of electrical contacts to prevent excessive electrical current to the battery powered components of the device.

When the authorized code is entered through the keypad, the powered PCB board signals a motor or other electromechanical actuating device to move internal components of the device to permit further movement of the access member to a third position, in which the power depleted internal battery can be removed and replaced with a new battery. In the illustrated example, this further movement of the access member is permitted by an actuator driven release of the shackle, with subsequent user withdrawal of the shackle from the lock body permitting movement of the cam to release the access member for user movement from the second position to the third position.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention. Descriptions of exemplary methods or processes are not limited to inclusion of all steps as being required in all cases, nor is the order that the steps are presented to be construed as required or necessary unless expressly so stated.

We claim:

1. A battery operated device comprising:
   a housing;
   an operating mechanism disposed within the housing, the operating mechanism including first and second sets of electrical contacts for transmitting power to the operating mechanism;
   an internal battery disposed within the housing, the internal battery being electrically connectable with the first set of electrical contacts for powering the operating mechanism; and
   an access member assembled with the housing and movable between a first position blocking external access to the second set of electrical contacts and connecting the first set of electrical contacts to the internal battery, and a second position permitting external access to the second set of electrical contacts and disconnecting the internal battery from the first set of electrical contacts.

2. The device of claim 1, wherein the access member retains the internal battery, such that movement of the access member to the second position moves the internal battery out of engagement with the first set of electrical contacts.

3. The device of claim 1, wherein the battery access member is further movable to a third position permitting external access to the internal battery for replacement of the internal battery.

4. The device of claim 3, further comprising a latch member movable between a latching position in which the latch member prevents movement of the access member to the third position, and a releasing position in which the latch member permits movement of the access member from the second position to the third position.

5. The device of claim 4, wherein the operating mechanism is operable to move the latch member from the latching position to the releasing position.

6. The device of claim 5, wherein the operating mechanism includes a user operable interface for entry of an authorized access code to restrict unauthorized operation of the operating mechanism.

7. The device of claim 6, wherein the user operable interface includes an electronic keypad.

8. The device of claim 4, wherein the operating mechanism comprises a locking mechanism including an access restricting structure movable between locked and unlocked positions, wherein the latch member is secured in the latching position when the access restricting structure is in the locked position.

9. The device of claim 8, wherein the access restricting structure comprises a shackle, and further wherein a portion of the shackle blocks movement of the latch member to the releasing position when the access restricting structure is in the locked position.

10. The device of claim 1, wherein the second set of electrical contacts is configured for electrical connection with an external battery when the access member is in the second position, the external battery being substantially identical to the internal battery.

11. A battery operated device comprising:
    a housing;
    an operating mechanism disposed within the housing, the operating mechanism including first and second sets of electrical contacts for transmitting power to the operating mechanism;
    an internal battery disposed within the housing, the internal battery being electrically connectable with the first set of electrical contacts for powering the operating mechanism; and an access member assembled with the housing and movable between a first position blocking external access to the internal battery and blocking external access to the second set of electrical contacts, a second position blocking external access to the internal battery and permitting external access to the second set of electrical contacts, and a third position permitting external access to the internal battery for replacement of the internal battery.

12. The device of claim 11, further comprising a latch member disposed within the housing and movable between a latching position in which the latch member prevents movement of the access member to the third position, and a releasing position in which the latch member permits movement of the access member to the third position.

13. The device of claim 12, wherein the operating mechanism comprises a locking mechanism including an access restricting structure movable between locked and unlocked positions, wherein the latch member is secured in the latching position when the access restricting structure is in the locked position.

14. The device of claim 13, wherein the access restricting structure comprises a shackle, and further wherein a portion of the shackle blocks movement of the latch member to the releasing position when the access restricting structure is in the locked position.

15. The device of claim 12, wherein the operating mechanism is operable to move the latch member from the latching position to the releasing position.

16. The device of claim 11, wherein the operating mechanism includes a user operable interface for entry of an authorized access code to restrict unauthorized operation of the operating mechanism.

17. The device of claim 16, wherein the user operable interface includes an electronic keypad.

18. An electronic padlock comprising:
a lock body;
a shackle assembled with the lock body and movable between locked and unlocked positions;
an electronic lock interface assembled with the lock body;
an electromechanical locking mechanism disposed within the body and operable to permit movement of the shackle from the locked position to the unlocked position in response to proper user manipulation of the electronic lock interface, the electromechanical locking mechanism including first and second sets of electrical contacts for transmitting power to the operating mechanism;

an internal battery disposed within the lock body and electrically connectable with the electromechanical locking mechanism by the first set of electrical contacts; and an access member assembled with the lock body and movable between a first position blocking external access to the internal battery and blocking external access to the second set of electrical contacts, a second position blocking external access to the internal battery and permitting external access to the second set of electrical contacts, and a third position permitting external access to the internal battery for replacement of the internal battery.

19. The padlock of claim 18, wherein movement of the access member to the second position disconnects the internal battery from the first set of electrical contacts, thereby preventing simultaneous power supply to the operating mechanism through both the first and second sets of electrical contacts.

20. The padlock of claim 18, wherein the access member retains the internal battery, such that movement of the access member to the second position moves the internal battery out of engagement with the first set of electrical contacts.

21. The padlock of claim 18, further comprising a latch member disposed within the lock body and movable between a latching position in which the latch member prevents movement of the access member to the third position, and a releasing position in which the latch member permits movement of the access member to the third position.

22. The padlock of claim 21, wherein the latch member is secured in the latching position when the shackle is in the locked position.

23. The padlock of claim 21, wherein a portion of the shackle blocks movement of the latch member to the releasing position when the shackle is in the locked position.

* * * * *